United States Patent [19]

Kleinberg

[11] Patent Number: 4,862,114
[45] Date of Patent: Aug. 29, 1989

[54] CRYSTAL OSCILLATORS USING NEGATIVE VOLTAGE GAIN, SINGLE POLE RESPONSE AMPLIFIERS

[75] Inventor: Leonard L. Kleinberg, Annapolis, Md.

[73] Assignee: The United States of America as represented by the Administrator of the National Aeronautics and Space Administration, Washington, D.C.

[21] Appl. No.: 210,488

[22] Filed: Jun. 23, 1988

[51] Int. Cl.[4] .............................................. H03B 5/32
[52] U.S. Cl. ................................ 331/158; 331/116 R; 331/135
[58] Field of Search ................... 331/116 R, 135, 136, 331/154, 158; 368/159; 330/294

[56] References Cited

U.S. PATENT DOCUMENTS 4,540,956  9/1985  Chauvin et al. ................. 331/158 X
4,603,306  7/1986  Kleinberg .................... 331/116 R X

FOREIGN PATENT DOCUMENTS 0038865  3/1977  Japan .................................. 331/158

Primary Examiner—Eugene R. LaRoche
Assistant Examiner—Robert J. Pascal
Attorney, Agent, or Firm—R. Dennis Marchant; John R. Manning; Ronald F. Sandler

[57] ABSTRACT

A simple and inexpensive crystal oscillator is provided which employs negative voltage gain, single pole response amplifiers. The amplifiers may include such configurations as gate inverters, operational amplifiers and conventional bipolar transistor amplifiers, all of which operate at a frequency which is on the roll-off portion of their gain versus frequency curve. Several amplifier feedback circuit variations are employed to set desired bias levels and to allow the oscillator to operate at the crystal's fundamental frequency or at an overtone of the fundamental frequency. The oscillator is made less expensive than comparable oscillators by employing relatively low frequency amplifiers and operating them at roll-off, at frequencies beyond which they are customarily used. Simplicity is provided because operation at roll-off eliminates components oridinarily required in similar circuits to provide sufficient phase-shift in the feedback circuitry for oscillation to occur.

13 Claims, 2 Drawing Sheets

CRYSTAL OSCILLATORS USING NEGATIVE VOLTAGE GAIN, SINGLE POLE RESPONSE AMPLIFIERS

ORIGIN OF THE INVENTION

The invention described herein was made by an employee of the U.S. Government, and may be manufactured and used by or for the Government for governmental purposes without the payment of any royalties thereon or therefor.

TECHNICAL FIELD

The invention pertains to crystal oscillators and, more particularly, to oscillators employing negative voltage gain, single pole response amplifiers with a crystal connected between the output and input of the amplifier.

BACKGROUND ART

Numerous oscillator circuits have been designed which fundamentally involve an amplifier and a tuned circuit, and more particularly crystals, where the crystal, in essence, sets the operating frequency of the circuit. Many of these circuits now employ gate invertors, operational amplifiers or bipolar transistor amplifiers. These circuits require passive components, in addition to the crystal, in the feedback loop, to provide sufficient phase-shift in the feedback loop to create the proper condition for oscillation. Most of the prior art circuits have the amplifier operate in the flat portion of their gain versus frequency curve. In these circuits, therefore, a relatively high frequency amplifier, which is relatively more expensive than its low frequency counterparts must be employed. Moreover, in some instances, the designer does not have the option of selecting higher frequency amplifiers because the amplifier is included in a dedicated microchip, such as in a computer, for the purpose of developing a clock, and the designer only provides an external crystal to work in conjunction with the amplifier. In such an event, with a conventional oscillator design, the amplifier may limit the clock to a lower frequency of operation than desired.

One example of such an instance are CMOS microprocessor chips which include a CMOS inverter amplifier where an external crystal is to be added to provide a clock. Here the CMOS inverter design itself may limit the oscillator frequency below that desired when a conventional oscillator design is employed.

Furthermore, prior art crystal oscillators require a substantial number of extra components or circuitry to allow the use of crystals operating at their overtone or harmonic frequencies.

STATEMENT OF THE INVENTION

Accordingly, it is an object of this invention to extend the usefulness of active devices employed in oscillator circuits significantly beyond each device's 3 db point on its gain versus frequency curve.

It is another object of the invention to provide oscillator circuits with a reduced number of components.

It is yet another object of the invention to provide oscillator circuits with less expensive components than conventional oscillator circuits operating at similar frequencies.

Briefly, these and other objects are achieved in an oscillator circuit which employs a negative voltage gain, single pole response amplifier operating on the roll-off portion of its gain versus frequency curve, at frequencies substantially beyond its 3 db point, with a crystal operating in its inductive mode connected in a feedback loop between the output and the input of the amplifier and a capacitance connected in parallel with the amplifier input terminal.

DETAILED DESCRIPTION OF THE INVENTION

An amplifier having a negative voltage gain, a one pole frequency response, and a small output impedence, is capable of sustaining oscillations when a crystal (or inductor) is connected between its input and output terminals, and a loading capacitance is connected between the input terminal and ground.

Such an amplifier may be characterized by $$K(\omega) = \frac{-K_o}{1 + J\frac{\omega}{\omega_3}}, \text{ where:} \qquad (1)$$

$K(\omega)$ is the voltage gain of the amplifier as a function of the radian frequency, $-K_o$ is the low frequency voltage gain, and $\omega_3$ is the 3 db point radian frequency.

Figure 1:
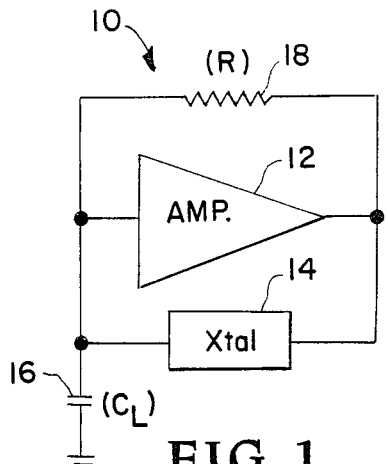
FIG. 1 is a schematic representation of a basic crystal oscillator in accordance with the present invention.

FIG. 1 shows the basic configuration of the amplifier 12 and the other components necessary to form oscillator 10. While the fundamental requirements related to the amplifier are that it have a negative voltage gain and a single pole frequency response, it is preferred, but not necessary, that the amplifier have a large gain.

Crystal 14, connected across the input and output of amplifier 12, operates in the inductive mode and the loading capacitor 16 ($C_L$), connected between the common connection of the crystal 14 and the input of amplifier 12, and ground, is the required capacitance to get the crystal to establish the specified frequency, the value of the capacitor being specified when ordering the crystal. Resistor 18 (R), is, in some specific embodiments of the invention, employed as a bias resistor. However, it also plays a fundamental function in setting the frequency of oscillation. It should be understood that where the magnitude of the resistor is very high, it may be ignored for the a.c. analysis of the circuit, including the determination of the driving point admittance (DPA), hereinafter discussed. The part that the resistor plays in setting the frequency of oscillation may be readily determined from DPA equation (3), below, and the below-stated condition for oscillation.

The driving point admittance is the term generally used to describe the input admittance, i.e., the reciprical of the input impedance, looking into a network at a particular point. For the instant invention, where a resistance and a crystal employed in the inductive mode both appear across an amplifier, from input to output, and where the input admittance is to be determined at the amplifier input, the DPA, when $|K_o| >> 1$ and the output impedance of the amplifier is low, may be expressed as:

$$DPA = (1 - K(\omega))Y_F \qquad (2)$$

where $Y_F$ is the admittance that appears between the input and output of the amplifier. Then $Y_F$ can be expressed as:

$$Y_F = \frac{1}{J\omega Lx} + \frac{1}{R},$$

where Lx is the inductance of the crystal and R is the resistance across the amplifier from input to output. With $Y_F$ thus defined, and with the capacitive admittance due to the loading capacitor ignored, the expression for DPA can be expanded as follows:

$$DPA = \left(1 - \frac{JK_o\omega_3}{\omega}\right)\left(\frac{1}{J\omega Lx} + \frac{1}{R}\right) = \qquad (3)$$

$$\frac{1}{J\omega Lx} - \frac{K_o\omega_3}{\omega^2 Lx} + \frac{1}{R} - \frac{JK_o\omega_3}{\omega R}$$

This expression for the DPA is essentially generic to these kinds of circuits, however, this expression does not cover those circuits where a capacitor is placed in series with a crystal to obtain a harmonic of the crystal frequency, as described in several of the later-described circuits. At this point it should be noted that if "R" is relatively large, the effect of the last two terms of the equation (3) expression, i.e., those including "R", on the DPA value, can be ignored because they approach zero. The practical effect of having a large resistance across the amplifier is that the resistance will have no significant effect on the circuit's frequency of oscillation. On the other hand, if the resistance is relatively small, the resistance across the amplifier will have a significant effect on the circuit's frequency of oscillation, i.e., placing a relatively low magnitude resistor across the amplifier is one way that such a circuit can be tuned to a particular frequency of operation.

When the capacitive admittance of the loading capacitor, $J\omega C_L$, cancels the DPA inductive admittance term, $1/J\omega Lx$, and the DPA negative conductance term, $$-\frac{K_o\omega_3}{\omega^2 Lx},$$

is greater than the DPA input conductance, which is essentially 1/R, the conditions for oscillation are satisfied, regardless of the magnitude of R. It should be noted that this analysis of the DPA and the conditions necessary for oscillation are generally applicable for all circuits constructed according to the invention, regardless of the particular type of amplifier employed, albeit, that the expression for the DPA can become somewhat more complex when additional impedances are placed across the amplifier.

The function of the amplifier, open loop, is to provide negative gain, i.e., inversion and gain from input to output, and to provide phase shift sufficient to provide oscillation when operated at frequencies significantly higher than the 3 db point of its gain versus frequency curve. In other words, once the crystal is selected for the desired frequency of operation, the amplifier is selected so that the crystal frequency is far down the amplifier's roll-off portion of the curve, thereby achieving phase shift through the amplifier. One advantage of this kind of a circuit is to provide an extended frequency range for a relatively low frequency and low cost component, i.e., typically the active component in this kind of circuit is operated in the flat portion of its gain versus frequency curve but this is not the case with the instant invention. Another advantage is that operation in the roll-off region allows for the elimination of components ordinarily required to obtain phase shift when the amplifier is operated in its flat region.

Figure 2:
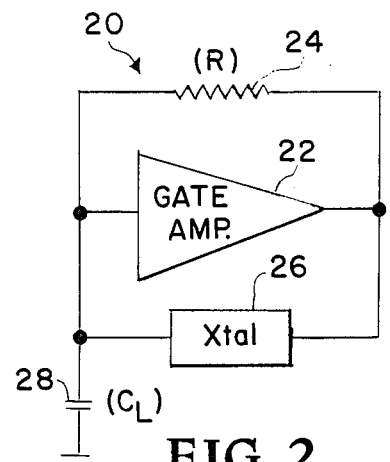
FIG. 2 is a schematic representation of a crystal oscillator circuit in accordance with the present invention where the amplifier is a gate inverter and the crystal is operated at its fundamental frequency.

FIG. 2 depicts a crystal oscillator 20 which includes a gate amplifier 22 with a bias resistor 24 connected between the input and output of the gate amplifier. A crystal 26 is also connected between the input and output of the gate amplifier. A loading capacitor 28 is connected, at one side, to the common connection of the crystal 26 and the input of the gate amplifier 22. The other side of the loading capacitor is normally connected to ground. In one embodiment of oscillator 20, the gate amplifier 22 is a CD4049 or MC14049, available from RCA or Motorola, Inc., respectively, the resistor 24 is a 1.2 MΩ resistor and the loading capacitor 28 is 10 pf. The resistor value of 1.2 MΩ was selected to approximately center bias the gate amplifier, which employs a 15 volt power supply. This results in a bias of about 7.5 V appearing at both the input and the output of amplifier 22. It should be noted that achieving the mid-level bias is fairly independent of the resistor value and, most likely, any resistor between 1 MΩ and 10 MΩ would have been suitable. The approximate center biasing is desirable because there is a requirement that the gate amplifier operate as an essentially linear amplifier, rather than a hard "on", hard "off" switch, in order to have the circuit oscillate.

Crystal 26, in this embodiment, has had fundamental frequency values of both 5 MHz and 10 MHz with the crystals being cut for operation in the inductive mode, i.e., the crystals look like an inductance at their frequency of operation with a specified loading capacitor of 10 pf.

In this embodiment of the invention the crystal could have typically been selected for operation at a fundamental frequency of from about 5 MHz to 30 MHz and cut for operation with a loading capacitance of from about 10 pf to 32 pf. The actual value of the load capacitor inserted into the circuit should take into consideration the stray capacitance appearing at the amplifier input.

Figure 2A:
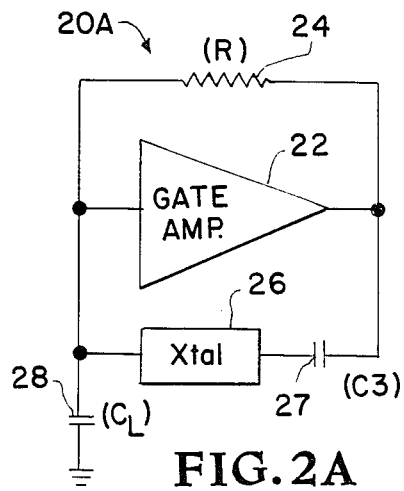
FIGS. 2A and 2B are schematic representations of crystal oscillator circuits of this invention where the amplifiers are gate inverters and the crystals are operated at an overtone frequency.

FIG. 2A, depicting oscillator 20A, is tha same as the circuit of FIG. 2 with the exception of the insertion of capacitor 29 (C3) in series with crystal 26. The purpose of the insertion of this capacitor is to allow the oscillator to operate at the third overtone or harmonic frequency of the crystal rather than at the fundamental frequency of the crystal. The value of the capacitance is selected so that its capacitive reactance, $X_{C3}$, is sufficiently large at the fundamental frequency to nullify the inductive reactance of the crystal, which inductive reactance is necessary to satisfy the conditions for oscillation. However, $X_{C3}$ is selected to be sufficiently small at the third overtone so that the inductive reactance of the crystal, $X_{Lx}$, dominates over the capacitive reactance, $X_{C3}$, thus allowing the crystal inductance and the loading capacitor to form a resonant circuit and permit oscillation at the overtone frequency.

Figure 2B:
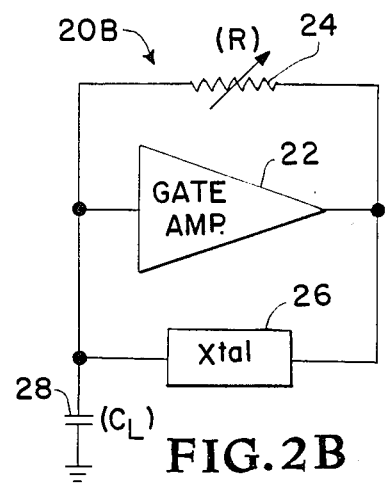

FIG. 2B shows a circuit which is a variation of the circuit of FIG. 2A with this circuit also being designed to obtain an overtone of the frequency provided by crystal 26. All of the elements of these two circuits are identical except for the magnitude of the resistor 24 and the absence of capacitor 29 from the circuit of FIG. 2B. As previously discussed with respect to DPA equation (3), which provides an essentially generic expression for the DPA of these kind of circuits, the resistance across the amplifier 22 can be ignored in terms of the DPA except when it is small. In the circuit of FIG. 2B, the magnitude of resistor 24 is intentionally made small enough to significantly effect the DPA and, as a result, obtain an overtone of the crystal frequency rather than its fundamental frequency. Thus, the circuit of FIG. 2B provides an alternative to that of FIG. 2A in terms of circuit operation at an overtone and, additionally, it has the advantage of eliminating capacitor 29. In FIG. 2B, resistor 24 is shown as variable to reflect the fact that an accurate calculation of the DPA is often difficult to obtain and the actual magnitude of the resistance to be employed is often determined, once an order of magnitude is calculated, with the use of a potentiometer which functions as a tuning element. In oscillator 20B, a 5 KΩ potentiometer is employed, which is set at approximately 3 KΩ.

Obtaining an overtone by using a low value resistor can be explained by reference to the DPA equation (3) terms which include "R", i.e., $$+\frac{1}{R} \text{ and } -\frac{JK_o\omega_3}{\omega R},$$

the first term representing input conductance due to "R" and the second term representing inductive admittance due to "R". By making "R" small, for example, in range of from 3 KΩ to 5 KΩ, both the input conductance and the inductive admittance become relatively large. However, the inductive admittance is frequency dependent and the larger "ω", the smaller the inductive admittance. Furthermore, for oscillation to occur, the magnitude of the admittance due to the crystal must be greater than the input conductance, i.e., $$\left| \frac{K_o\omega_3}{\omega^2 Lx} \right|.$$

At the fundamental frequency ($\omega_1$), the inductive admittance due to "R", which appears in parallel with the loading capacitor, $$-\frac{JK_o\omega_3}{\omega R},$$

is designed, by varying R, to be greater than the capacitive admittance of $C_L$. However, at the third overtone, $3\omega_1$, the inductive admittance due to "R" becomes one-third its magnitude at $\omega_1$. Thus, at the third overtone, the capacitive admittance will, by design, dominate over the inductive admittance due to "R" and the circuit will oscillate.

Figure 3:
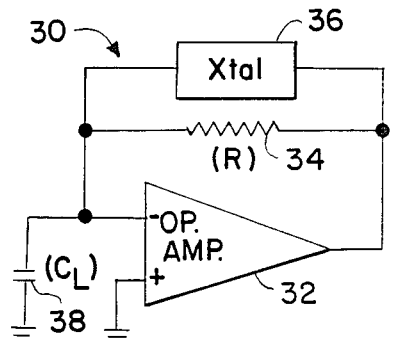
FIG. 3 is another schematic representation of a crystal oscillator circuit of this invention where the amplifier is an operational amplifier and the crystal is operated at its fundamental frequency.

FIG. 3 depicts a crystal controlled oscillator 30 which includes an operational amplifier 32. This circuit is, in effect, the operational amplifier equivalent of FIG. 2. A resistor 34 and a crystal 36 are both connected between the inverting input and the output of the operational amplifier 32. The non-inverting input is grounded. A loading capacitor 38 is connected between the inverting input and ground.

Resistor 34 is used for d.c. continuity and not for establishing a bias level which is established by the operational amplifier internally, and primarily establishes the input conductance at the inverting input of the amplifier. Crystal 36 is operated in the inductive mode with the oscillator being operated at the fundamental frequency of the crystal. The loading capacitor 38 is used to set the proper oscillator frequency, in this instance at the fundamental frequency of the crystal.

For fundamental operation at 2 MHz the resistor 34 is typically 100 KΩ and the capacitor 38 is 10 pf to 32 pf. For frequencies in the range of between 200 KHz and 500 KHz an OP-07 operational amplifier is suitable, for a range of about 1 MHz to 5 MHz an OP-27 may be employed, and for a range of from 20 MHz to 40 MHz an OP-37 may be used. All of these operational amplifiers are available from Precision Monolithics, Inc. For an oscillator operating at 2 MHz, an OP-27 operational amplifier was employed with a ±12 volt power supply.

Figure 3A:
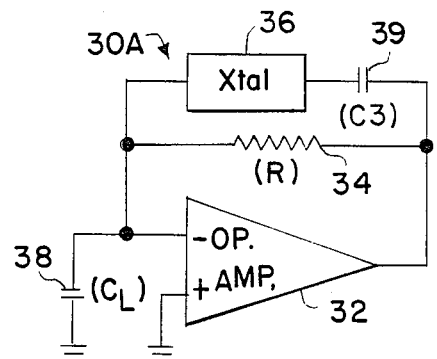
FIGS. 3A and 3B are schematic representations of crystal oscillator circuits of this invention where the amplifiers are operational amplifiers and the crystals are operated at an overtone frequency.
Figure 3B:
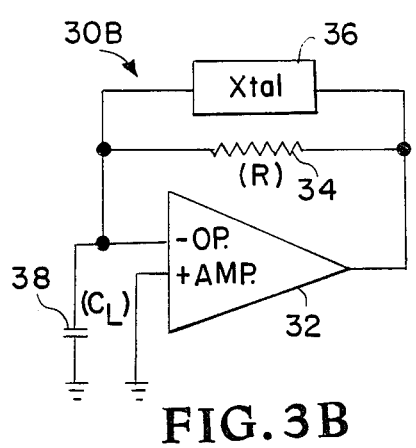

FIG. 3A shows oscillator 30A which is the same as oscillator 30 except for the insertion of capacitor 39 (C3) in series with crystal 36 for the purpose of having the circuit oscillate at the third overtone of the crystal's fundamental frequency. Capacitor 39 is sized and functions in the same fashion as capacitor 29 in oscillator 20A. FIG. 3B, in turn, shows oscillator 30B, which is the same as oscillator 30 except for the magnitude of resistor 34. The magnitude of the resistor in this circuit is 3 KΩ, much less than resistor 34 in FIG. 3, to have the circuit oscillate at the third overtone in the same fashion as the relatively small resistor allows for overtone operation in oscillator 20B.

A possible alternative embodiment to the circuit of FIG. 3B would have a resistor connected between the inverting input of the operational amplifier and ground, rather than from its inverting input to its output. However, thus configured, the circuit does not behave in accordance with DPA equation (3) and the resistor will not present an additional inductive admittance. Without the presence of this admittance factor, the resistor cannot be made to force the circuit to oscillate at an overtone by making the resistor small in magnitude.

Figure 4:
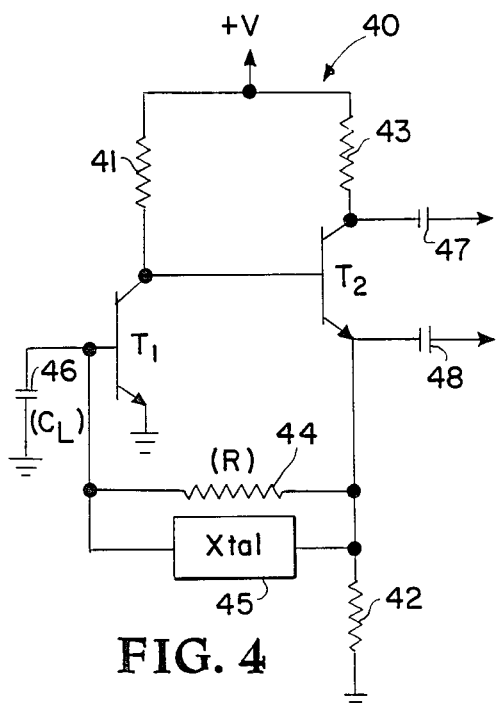
FIG. 4 is a schematic representation of a crystal oscillator circuit of this invention where the amplifier is a bipolar transistor amplifier and the crystal is operated at its fundamental frequency.

FIG. 4 depicts a crystal controlled oscillator 40 according to the instant invention which employs a bipolar transistor amplifier rather than the previously discussed oscillators that employ gate or operational amplifiers. The first stage is comprised of an NPN transistor in a common emitter configuration, with resistor 41 in its collector, which stage may be characterized as a voltage gain stage with inversion and a relatively high output impedance. The second stage is comprised of an NPN transistor which is essentially in a common collector configuration, i.e., an emitter follower with resistor 42 as its primary load resistor and a small load resistor, 43, in its collector. This stage can generally be characterized as a non-inverting stage with a voltage gain of somewhat less than one and a relatively low output impedance for signals taken off the emitter. The second stage is employed as an isolation or buffer stage for the first stage so that the feedback loop, comprised of 2.2 MΩ resistor 44 and crystal 45, as well as the load capacitor 46, will not load the first stage down. Thus, this two stage amplifier is comparable to the gate and operational amplifiers of FIGS. 2 and 3, with elements 44, 45 and 46 functioning in a similar fashion to complete oscillator 40. It should be noted, however, that the oscillator output can be taken from either the emitter or collector of $T_2$, but the feedback loop must be connected to the emitter of $T_2$ to satisfy the fundamental requirement that the feedback loop be connected to an output which is inverted in terms of the input. The emitter output will be, in essence, at the signal level as it exists at the $T_1$ collector but, when the oscillator is driving a very low input impedance circuit, there may be a substantial loading effect reflected back to the first stage. Taking the output from the $T_2$ collector, however, will provide more isolation, but the signal will be inverted and at a substantially lower voltage level. In FIG. 4, $T_1$ is a 2N930, $T_2$ is a 2N5088, respectively, crystal 45 is cut for a fundamental frequency of 11.7 MHz, and the load capacitor, 46, may be in the range of from 10 pf to 32 pf. It should be noted that the input admittance of $T_1$ is significantly capacitive and this factor must be considered in choosing the magnitude of loading capacitor 46. While resistor 44, crystal 45 and the load capacitor 46 perform the same general functions as they do in the previously noted oscillator circuits employing gate and operational amplifiers, with the bipolar transistor amplifier configuration, the magnitude of resistor 44 is fairly critical in setting the mid-level bias of $T_1$.

At this point it should be recognized that the amplifier, while described herein as comprised of NPN transistors, could employ PNP transistors or, alternatively, one NPN and one PNP transistor. Moreover, while capacitors 47 and 48 are sized at 0.001 uf in oscillator 40, they are merely coupling capacitors, and their proper sizing in any given application is determined by the oscillator frequency and the input impedance of the circuitry being driven by the oscillator. With the described two NPN transistor configuration, a 10 volt power supply is appropriate.

Figure 4A:
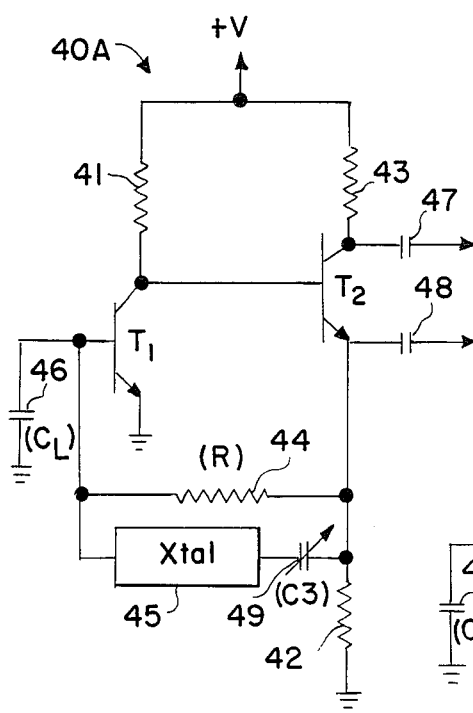
FIGS. 4A and 4B are schematic representations of a crystal oscillator circuit of this invention where the amplifiers are bipolar transistor amplifiers and the crystals are operated at an overtone frequency.
Figure 4B:
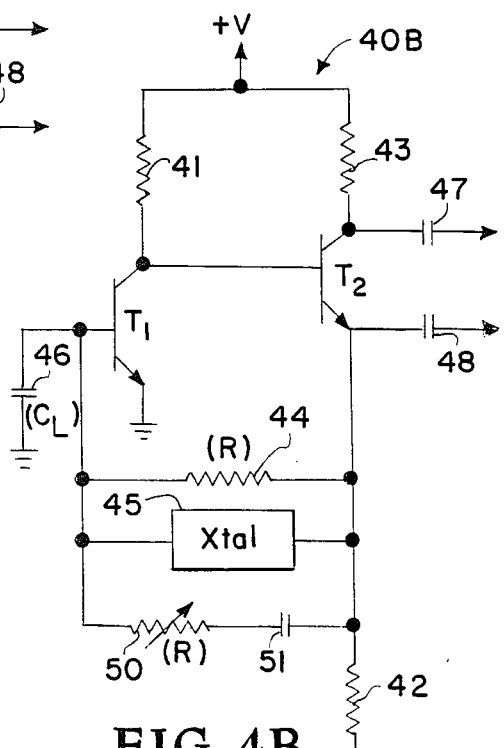

FIG. 4A, depicting oscillator 40A is the same as FIG. 4, except for the addition of variable capacitor 49 in series with crystal 45, which is so positioned and sized, in the range of 15 pf to 65 pf, to enable the oscillator to be tuned to operate at the crystal's third overtone, much the same as in FIGS. 2A and 3A. FIG. 4B, depicting oscillator 40B is, in essence, very similar to the oscillator shown in FIG. 4, modified with a small "R", i.e., resistor 50, to enable the oscillator to be tuned to the crystal's third overtone. This is done by inserting the variable resistor 50, adjusted to about 1.5 KΩ, in the amplifier's feedback loop in a fashion which is similar to FIGS. 2B and 3B. In this circuit, elements $T_1$, $T_2$, 41, 42, 43, 44, 45, 47 and 48 are the same as in FIG. 4. However, because of the particular biasing requirements of the bipolar transistor amplifier configuration, the feedback network is somewhat different. Resistor 44 is employed to independently set the bias, while resistor 50 independently tunes the oscillator to the third overtone frequency. Capacitor 51, at 0.001 uf, is employed simply as a d.c. blocking capacitor so that the bias is not disturbed, while resistor 44 is sufficiently high in magnitude that it does not affect the tuning of the circuit, i.e., in an a.c. analysis of the feedback loop, only elements 45, 50 and 51 are of any consequence. The loading capacitor 46 in this circuit is set to the low side, in the order of 10 pf. The magnitude of resistor 50 was fairly critical to achieving operation at the third overtone, which was about 35.1 MHz.

Once again, it should be emphasized that in all instances the amplifiers were selected to operate well into their roll-off frequencies. With FIGS. 4, 4A and 4B, this required the proper selection of transistors $T_1$ and $T_2$. It should also be emphasized that the advantage of using low cost, low frequency active components for relatively high frequency operation are even more evident when operating at an overtone.

I claim:

1. An oscillator circuit including:
   a negative voltage gain, single pole response amplifier, having at least one input and at least one output, said amplifier operating on the roll-off portion of its gain versus frequency curve;
   a network including a crystal, connected across said amplifier, from one of said inputs to one of said outputs, said crystal operating in its inductive mode;
   a resistor connected across said amplifier from said one of said inputs to said one of said outputs; and
   a loading capacitor connected from said one of said inputs to ground.

2. The oscillator of claim 1 wherein said amplifier is a gate amplifier.

3. The oscillator of claim 1 wherein said amplifier is an operational amplifier with inverting and non-inverting inputs.

4. The oscillator of claim 1 wherein said amplifier is a bipolar transistor amplifier.

5. The oscillator of claim 1 wherein said network includes a capacitor in series with said crystal, said series capacitor being sized to set the oscillator frequency at an overtone frequency of said crystal.

6. The oscillator of claim 2 wherein said network includes a capacitor in series with said crystal, said series capacitor being sized to set the oscillator frequency at an overtone frequency of said crystal.

7. The oscillator of claim 3, wherein said network includes a capacitor in series with said crystal, said series capacitor being sized to set the oscillator frequency at an overtone frequency of said crystal, said one of said inputs being said inverting input.

8. The oscillator of claim 4 wherein said network also includes a capacitor in series with said crystal, said series capacitor being sized to set the oscillator frequency at an overtone frequency of said crystal.

9. The oscillator of claim 2 wherein said resistor is sized to set the bias of said amplifier.

10. The oscillator of claim 2 wherein said resistor is sized to set the oscillator frequency at an overtone frequency of said crystal.

11. The oscillator of claim 3 wherein said resistor is sized to set the oscillator frequency at an overtone frequency of said crystal.

12. The oscillator of claim 4 wherein said resistor is sized to set the bias of said amplifier.

13. The oscillator of claim 4 wherein said network also includes a series resistor-capacitor circuit across said crystal, said series resistor being sized to set the oscillator frequency at an overtone frequency of said crystal.

* * * * *